(12) United States Patent
Wakiyama et al.

(10) Patent No.: US 10,297,473 B2
(45) Date of Patent: May 21, 2019

(54) LIQUID PROCESSING APPARATUS

(71) Applicant: Tokyo Electron Limited, Tokyo (JP)

(72) Inventors: Terufumi Wakiyama, Kumamoto (JP); Norihiro Ito, Kumamoto (JP); Jiro Higashijima, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/681,672

(22) Filed: Aug. 21, 2017

(65) Prior Publication Data
US 2017/0345689 A1   Nov. 30, 2017

Related U.S. Application Data

(63) Continuation of application No. 14/483,252, filed on Sep. 11, 2014, now Pat. No. 9,773,687.

(30) Foreign Application Priority Data

Sep. 27, 2013 (JP) ................................. 2013-201972
Aug. 1, 2014 (JP) ................................. 2014-157879

(51) Int. Cl.
*H01L 21/67* (2006.01)
*B08B 17/00* (2006.01)

(52) U.S. Cl.
CPC ........ *H01L 21/67051* (2013.01); *B08B 17/00* (2013.01); *H01L 21/67017* (2013.01); *H01L 21/6719* (2013.01)

(58) Field of Classification Search
CPC ......... H01L 21/67017; H01L 21/67051; H01L 21/6719; B08B 17/00
See application file for complete search history.

(56) References Cited

U.S. PATENT DOCUMENTS

| 6,752,872 B2 | 6/2004 | Inada et al. |
| 2001/0003968 A1 | 6/2001 | Kitano et al. |
| 2007/0240638 A1* | 10/2007 | Akimoto ........... H01L 21/67051 118/52 |
| 2007/0240824 A1 | 10/2007 | Kaneko et al. |
| 2007/0289528 A1 | 12/2007 | Nanba et al. |

(Continued)

FOREIGN PATENT DOCUMENTS

| JP | 2002-118051 A | 4/2002 |
| JP | 2008-112760 A | 5/2008 |

(Continued)

*Primary Examiner* — Michael E Barr
*Assistant Examiner* — Benjamin L Osterhout
(74) *Attorney, Agent, or Firm* — Abelman, Frayne & Schwab

(57) ABSTRACT

A liquid processing apparatus performs a liquid processing on a rotating substrate by supplying a processing liquid. Surrounding members surround a region including an upper space of a cup body surrounding the rotating substrate and provided with an opening above the substrate. An air flow forming portion forms a descending air flow from an upper side of the cup body. A bottom surface portion blocks between the cup body and the surrounding member along a circumferential direction. An exhaust port is provided above the bottom surface portion and outside the cup body to exhaust an atmosphere in a region surrounded by the surrounding members and the bottom surface portion.

15 Claims, 9 Drawing Sheets

(56) References Cited

U.S. PATENT DOCUMENTS

| | | | |
|---|---|---|---|
| 2010/0032097 A1* | 2/2010 | Ohashi | H01L 21/67034 156/345.55 |
| 2012/0227768 A1* | 9/2012 | Morita | B08B 15/002 134/18 |
| 2012/0318432 A1* | 12/2012 | Nishibayashi | H01L 21/187 156/64 |

FOREIGN PATENT DOCUMENTS

| | | |
|---|---|---|
| JP | 2009-246163 A | 10/2009 |
| JP | 2010-192686 A | 9/2010 |
| JP | 2013-187395 A | 9/2013 |

* cited by examiner

LIQUID PROCESSING APPARATUS

CROSS-REFERENCE TO RELATED APPLICATIONS

This application is a continuation of U.S. patent application Ser. No. 14/483,252, filed on Sep. 11, 2014, which claims priority from Japanese Patent Application Nos. 2013-201972 and 2014-157879, filed on Sep. 27, 2013 and Aug. 1, 2014, respectively, all of which are incorporated herein in their entireties by reference.

TECHNICAL FIELD

The present disclosure relates to a technique for exhausting a space in which a liquid processing is performed on a substrate.

BACKGROUND

In a single liquid processing unit (a liquid processing apparatus) in which a liquid processing is performed on a semiconductor wafer (hereinafter, referred to as a "wafer") serving as a substrate by supplying various processing liquids, an alkaline or acidic chemical liquid is supplied to a wafer surface that is rotating to remove dusts or natural oxides from the wafer surface. The chemical liquid remaining on the wafer surface is removed by a rinse liquid. When the supply of the rinse liquid is stopped while rotating the wafer, the remaining rinse liquid is scattered, so that the wafer is dried. Here, a recovery cup (a cup body) is provided around the wafer to recover the processing liquid, and the liquid processing is performed under a clean atmosphere in which a downflow (a descending air flow) is formed towards the recovery cup.

Meanwhile, a swirling flow is generated above the rotating wafer to flow from a central side towards an outer peripheral side while swirling towards a rotational direction of the wafer. Since mists or vapor containing the chemical liquid remain around the recovery cup in some cases, the components thereof may be blown up by the swirling flow generated above the wafer, and re-attached to the dried wafer, thereby causing contamination.

Here, Japanese Patent Laid-Open No. 2010-192686 discloses a substrate processing apparatus in which a partition wall is provided to vertically partition a processing room accommodating a substrate holding unit and a cylindrical cup surrounding a periphery of the substrate holding unit such that the inside of the processing chamber is divided into smaller sections to enhance replacement efficiency of the mists scattered from the cup into the processing chamber (see ibid., paragraphs [0008] to [0010], and FIG. 1).

However, Japanese Patent Laid-Open No. 2010-192686 fails to disclose a method of suppressing contamination of the substrate which is caused by the above-mentioned swirling flow when the mists remain around the cup.

SUMMARY

In an exemplary embodiment, the present disclosure provides a liquid processing apparatus in which a liquid processing is performed by supplying a processing liquid. The apparatus includes a rotatable substrate holding unit configured to hold a substrate; a cup body configured to surround the substrate holding unit and provided with an opening above the substrate; a surrounding member configured to surround a region including an upper space of the cup body from an outside of the cup body; an air flow forming portion configured to form a descending air flow from in the cup body an upper side of the cup body; a bottom surface portion provided along a circumferential direction of the cup body and configured to block a space between the cup body and the surrounding member; and an exhaust port provided above the bottom surface portion and outside the cup body to exhaust an atmosphere in a region surrounded by the surrounding member and the bottom surface portion.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
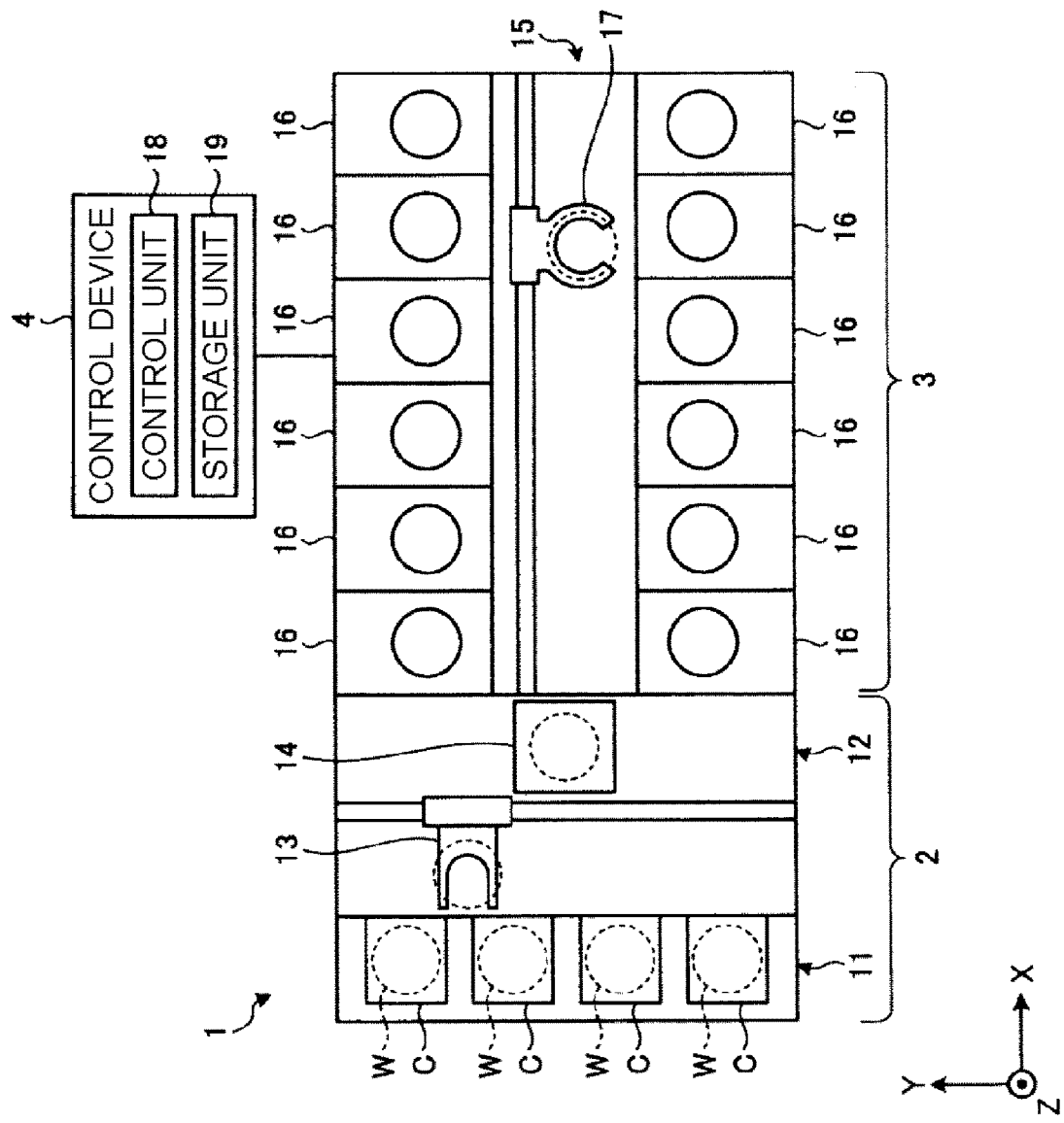
FIG. 1 is a plan view illustrating an outline of a substrate processing system provided with a processing unit according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure has been made in consideration of such problems and an object of the present disclosure is to provide a liquid processing apparatus in which an atmosphere around a cup body is able to be maintained in a clean state.

In an exemplary embodiment, the present disclosure provides a liquid processing apparatus in which a liquid processing is performed by supplying a processing liquid. The apparatus includes a rotatable substrate holding unit configured to hold a substrate; a cup body configured to surround the substrate holding unit and provided with an opening above the substrate; a surrounding member configured to surround a region including an upper space of the cup body from an outside of the cup body; an air flow forming portion configured to form a descending air flow from in the cup body an upper side of the cup body; a bottom surface portion provided along a circumferential direction of the cup body and configured to block a space between the cup body and the surrounding member; and an exhaust port provided above the bottom surface portion and outside the cup body to exhaust an atmosphere in a region surrounded by the surrounding member and the bottom surface portion.

The bottom surface portion may be provided at a position where its top surface is flush with an upper end of the cup body.

The liquid processing apparatus may have the following configurations.

The exhaust port is opened towards a direction intersecting with a tangent line extending in a rotation direction of the substrate holding unit in a circle centered at a rotation center of the substrate holding unit.

The surrounding member is provided with a compartment wall configured to compart from the region surrounded by the surrounding member and the bottom surface portion such that a flow path is formed to guide the exhausted air flow downwardly, and the exhaust port is formed on the compartment wall. Alternatively, the liquid processing apparatus further includes a flow path configured to allow the air flow exhausted from the exhaust port to flow downwardly. A plurality of the exhaust ports is provided along the circumferential direction of the cup body.

The exhaust port is provided at a corner of the surrounding member configured in a rectangular shape when viewed from the top. Alternatively, the surrounding member is configured in a cylindrical shape, and the exhaust port is provided with a guide plate configured to guide the air flow flowing along the cylindrical surrounding member towards the exhaust port.

The liquid processing apparatus further includes a processing liquid supply mechanism including: a nozzle configured to supply the processing liquid to the substrate; a nozzle arm configured to hold the nozzle at its tip end; and a rotation driving unit provided at a base end portion of the nozzle arm and configured to rotationally drive the nozzle arm around the base end portion so as to move the nozzle between a processing position above the substrate held in the substrate holding unit and a retreat position retreated from the processing position. The rotation driving unit is provided at a position facing the exhaust port. In this case, the surrounding member is provided with a partition wall which is configured to partition a region in which the processing liquid supply mechanism is provided and a space above the cup body, and is provided with a passage port configured to pass the nozzle arm holding the nozzle, and the passage port is used as an exhaust port instead of the exhaust port provided at a position facing the rotation driving unit to exhaust the atmosphere in the region surrounded by the surrounding member and the bottom surface portion and to exhaust an atmosphere in a region where the processing liquid supply mechanism is provided from the position facing the rotation driving unit.

The exhaust port is a vertically extending slit.

Alternatively, the liquid processing apparatus may have the following configurations.

The cup body is provided with a first cup configured to receive the processing liquid supplied to the substrate and a second cup configured to cover the first cup from the top, such that an exhaust path is formed between the first cup and the second cup, and the bottom surface portion is provided without a gap with the second cup.

The bottom surface portion is provided with a first bottom surface portion and a second bottom surface portion disposed above the first bottom surface portion, and the exhaust port is formed on the second bottom surface portion. Further, a buffer space is formed between the first bottom surface portion and the second bottom surface portion, and an exhaust unit is connected to the first bottom surface portion.

The exhaust port is formed on the bottom surface portion at a position facing the surrounding member so as to extend along the surrounding member. Further, a descending air flow forming unit is provided at an upper side of the substrate holding unit to form a descending air flow in a region surrounded by the surrounding member and the bottom surface portion.

The liquid processing apparatus further includes a processing liquid supply mechanism including: a nozzle configured to supply the processing liquid to the substrate; a nozzle arm configured to hold the nozzle at its tip end; and a rotation driving unit provided at a base end portion of the nozzle arm and configured to rotationally drive the nozzle arm around the base end portion so as to move the nozzle between a processing position above the substrate held in the substrate holding unit and a retreat position retreated from the processing position. The retreat position is set to a position where the nozzle arm of the processing liquid supply mechanism is disposed to extend along the surrounding member, and the exhaust port is disposed between the processing liquid supply mechanism that retreats the nozzle arm to the retreat position and the surrounding member.

In accordance with the present disclosure, components of a cleaning liquid flowing out around the cup body may be discharged efficiently by using a swirling flow formed above the rotating substrate held in the substrate holding unit.

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and a processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the liquid processing system 1 is provided with a control device 4. The control device 4 is, for example, a computer, and includes a control unit 18 and a storage unit 19. The storage unit 19 stores a program that controls various processings performed in the liquid processing system 1. The control unit 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the transfer unit 14. The wafer W placed on the transfer unit 14 is taken out from the transfer unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
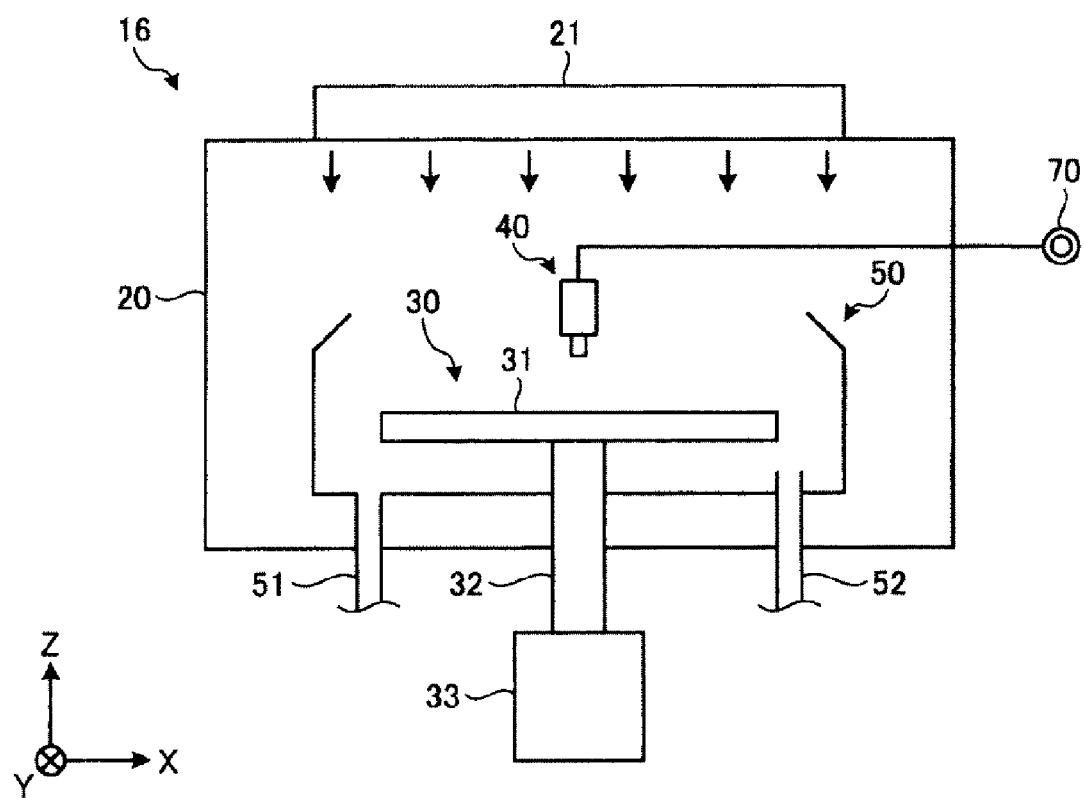
FIG. 2 is a vertical cross-sectional side view illustrating an outline of the processing unit.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside.

The processing unit 16 as outlined above corresponds to the liquid processing apparatus of the present exemplary embodiment which performs a liquid processing with a processing fluid, which is the processing liquid. The processing unit 16 has a function to suppress chemical liquid components (mists or vapor of a chemical liquid) from remaining around the recovery cup 50, and discharge the chemical components from the chamber 20 by using the swirling flow flowing out from the rotating wafer W. Hereinafter, a configuration related to the above-described functions will be described with reference to FIGS. 3 to 5.

Figure 3:
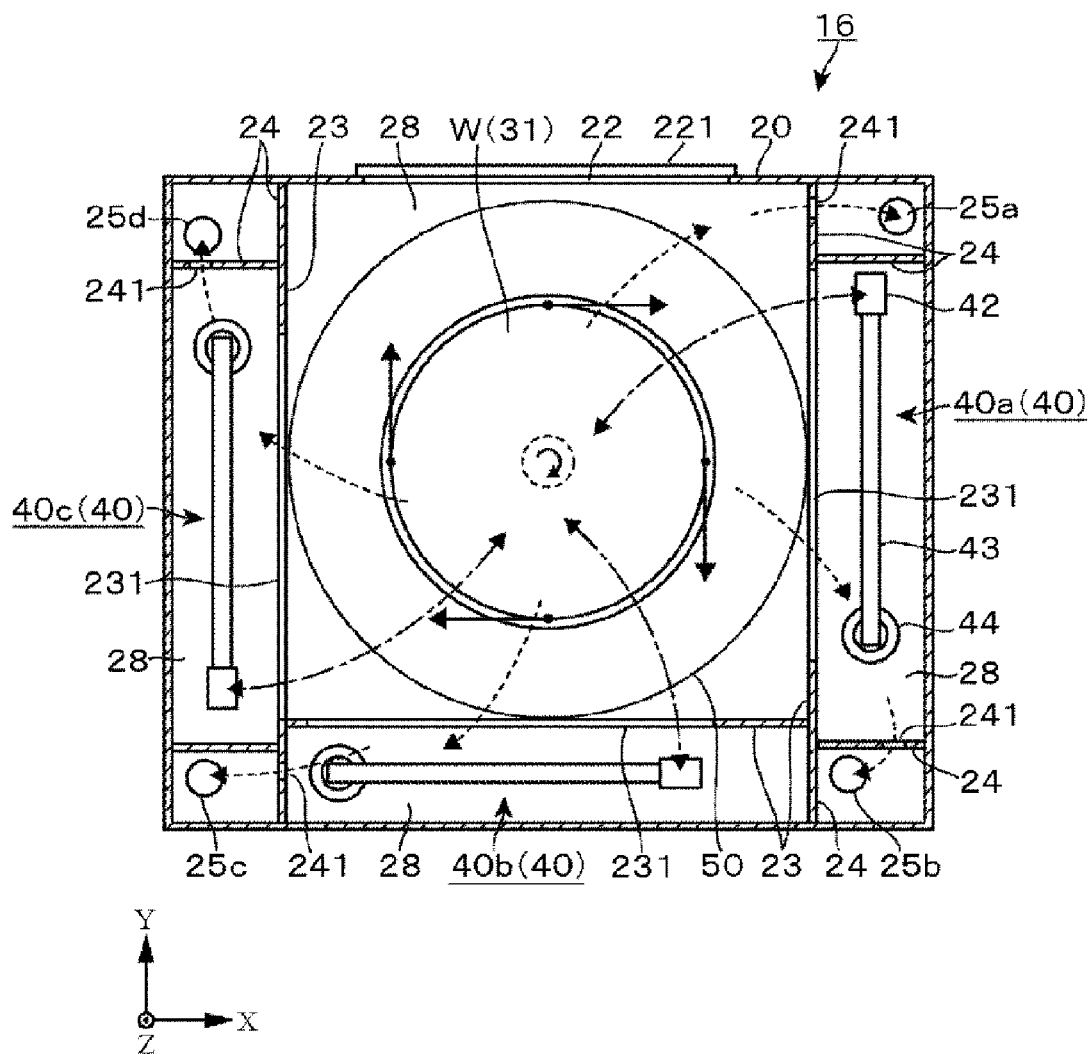
FIG. 3 is a plan view illustrating details of the processing unit.

As illustrated in FIG. 3, the chamber 20 in the present exemplary embodiment is configured as a case in a rectangular shape when viewed from the top. On one of the sidewalls of the chamber 20, a carry-in/out port 22 is provided to be opened or closed by a shutter 221 such that carry-in/out of the wafer W is performed.

Figure 4:
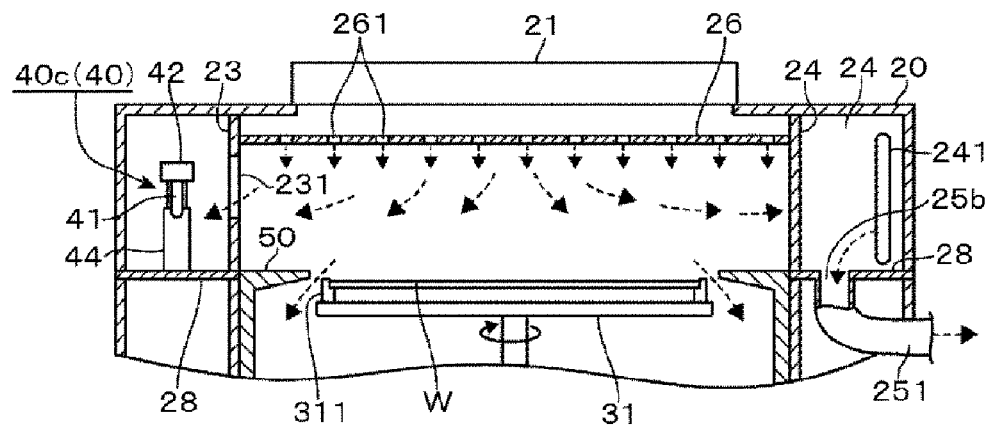
FIG. 4 is a vertical cross-sectional view illustrating an upper region of the processing unit in an enlarged scale.

Further, as illustrated in FIGS. 3 and 4, three sets of processing liquid supply mechanisms 40a to 40c, which constitute the processing fluid supply unit 40 as described above, are provided near three sidewalls which are not provided with the carry-in/out port 22 in the chamber 20, respectively. Each of the processing liquid supply mechanisms 40a to 40c is provided with a nozzle unit 41 configured to supply the processing fluid onto the surface of the rotating wafer W, a nozzle head 42 equipped with the nozzle unit 41, a nozzle arm 63 provided to extend horizontally and configured to hold the nozzle head 42 at its tip end, a rotation driving unit 44 configured to support a base end portion of the nozzle arm 43 and rotationally drive the nozzle arm 43 so as to move the nozzle unit 41 between a processing position above the wafer W and a retreat position retreated from the processing position. Each of the processing liquid supply mechanisms 40a to 40c shares supply of an acidic or alkaline chemical liquid which is the processing fluid, or a rinse liquid such as deionized water (DIW).

As illustrated in FIG. 4 which is a vertical cross-sectional view illustrating an upper region of the processing unit 16 in an enlarged scale, each of the processing liquid supply mechanisms 40a to 40c is disposed in the vicinity of the sidewall of the chamber 20, and supported by a partition plate 28 configured to partition a space in the chamber 20 vertically. Further, as illustrated in FIG. 3, when the nozzle units 41 are moved to the retreat position, the processing liquid supply mechanisms 40a to 40c are disposed in a direction where the nozzle arms 43 extend along the sidewall surfaces of the chamber 20, respectively.

In each of the processing liquid supply mechanisms 40a to 40c, a positional relationship between the rotation driving unit 44 and the nozzle unit 41 is set such that the rotation driving unit 44 is disposed at a downstream side of a tangent line extending in a rotation direction of the wafer W rotating clockwise when viewed from the top, and the nozzle units 41 is disposed at an upstream side of the tangent line. A direction where the tangent line extends from the wafer W coincides with a direction where the tangent line extends in a rotation direction of the holding unit 31 in a circle centered at a rotation center of the rotating holding unit 31. In FIG. 3, arrows depicted by bold lines indicate the tangent lines, and arrows depicted by chain lines indicate a movement path of the nozzle units 41 between the retreat position and the processing position.

Further, as illustrated in FIGS. 3 and 4, in the chamber 20, the recovery cup 50 (the cup body) is provided with an opening above the wafer W held in the substrate holding mechanism 30 (the substrate holding unit), and a partition wall 23 is provided to partition a space above the recovery cup 50 and a region in which each of the processing liquid supply mechanisms 40a to 40c is disposed.

Figure 5:
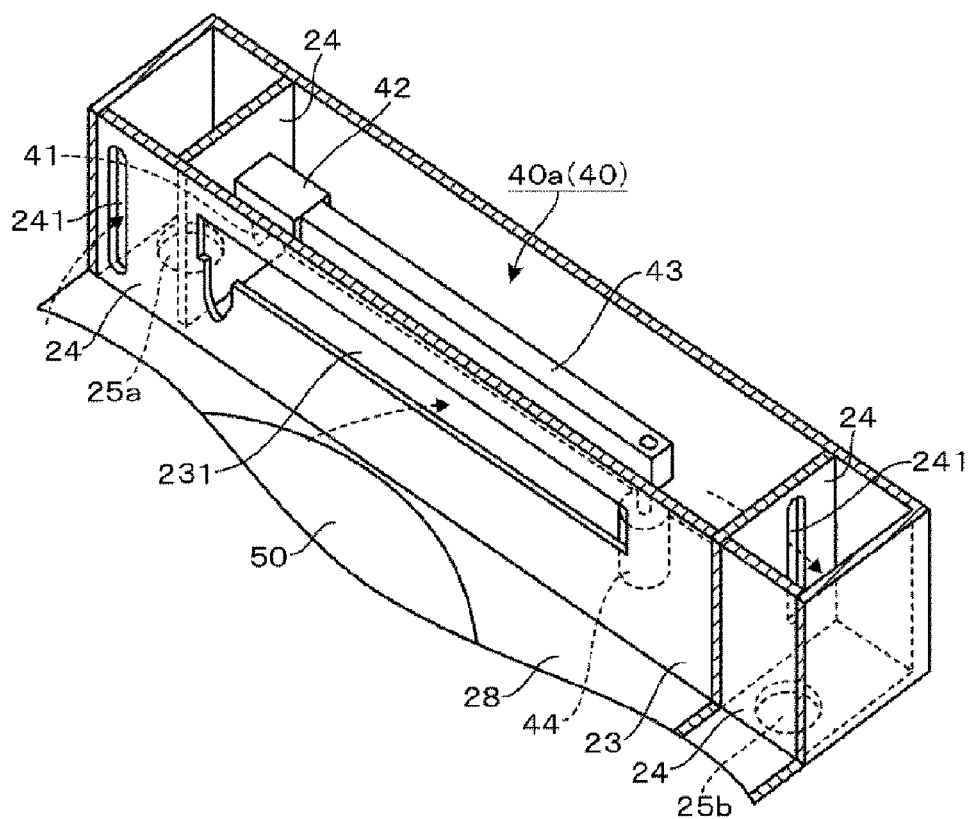
FIG. 5 is a perspective view illustrating a region where slits for exhaust or a processing liquid supply mechanism are provided in the processing unit in an enlarged scale.

As illustrated in FIG. 5, which illustrates the vicinity of a region where a processing liquid supply mechanism 40a is provided in an enlarged scale, each partition wall 23 is formed with a passage port 231 to pass the nozzle unit 41, the nozzle head 42 and the nozzle arm 43 transversely when the nozzle arm 43 is rotated. The partition wall 23 suppresses particles generated in the rotation driving unit 44 of each of the processing liquid supply mechanisms 40a to 40c from entering the processing atmosphere of the wafer W.

Next, as illustrated in FIG. 3, at four corners (edges) of the chamber 20 having a rectangular shape when viewed from the top, openings 25a to 25d are provided on the partition plate 28. Each of the openings 25a to 25d is connected to an exhaust pipe 251 configured to exhaust an atmosphere in the chamber 20.

The space above the partition plate 28 on which each of the openings 25a to 25d is provided is comparted from the space above the recovery cup 50 or the spaces where the processing liquid supply mechanisms 40a to 40c are disposed by compartment walls 24 disposed along the sidewalls of the chamber 20.

Slits 241 extending upwardly from a lower end position near a top surface of the partition plate 28 are opened in a transverse direction on the compartment walls 24 disposed in a direction intersecting with the tangent lines, among the compartment walls 24 (see, e.g., FIGS. 4 and 5). Accordingly, as illustrated in FIG. 3, the slits 241 provided on the compartment walls 24 surrounding the opening 25a is opened towards the space above the recovery cup 50, and the other three openings 25b to 25d are opened towards the spaces where the processing liquid supply mechanisms 40a to 40c are disposed. The vertically extending slits 241 discharge an air flow in the chamber 20 while suppressing any gas from remaining at the top surface side of the partition plate 28. The compartment walls 24 form flow paths that guide a flow of gas flowing out through the slits 241 towards the openings 25a to 25d to a lower side.

As illustrated in FIG. 4, a rectifying plate 26 provided with a plurality of supply ports 261 is disposed below the aforementioned FFU 21. A clean gas (e.g., clean air) is supplied evenly to the space above the recovery cup 50 through the rectifying plate 26 to form a downflow. The FFU 21 or the rectifying plate 26 corresponds to an air flow forming unit in the present exemplary embodiment.

Further, the holding unit 31 is provided with a plurality of support pins 311 configured to support a wafer W. A processing is performed in a state where the wafer W is held by the support pins 311.

Further, in the chamber 20 of the processing unit 16 of the present exemplary embodiment, the recovery cup 50 and a member surrounding the recovery cup 50 (e.g., a sidewall of the chamber 20 at the side where the carry-in/out port 22 is provided, or the aforementioned partition wall 23 or compartment walls 24) are blocked in relation to each other by the partition plate 28 along the circumferential direction of the recovery cup 50.

Here, the partition plate 28, which blocks a space between the recovery cup 50 and the sidewall of the chamber 20, the partition wall 23 or the compartment wall 24, is disposed such that the top surface of the partition plate 28 is flush with an upper end of the recovery cup 50. Further, since the top surface of the partition plate 28 is flat, the chemical components are suppressed from remaining around the recovery cup 50 or on the partition plate 28. Further, the space in the chamber 20 is comparted vertically by the partition plate 28. The partition plate 28 blocking a space between the recovery cup 50 and the sidewall of the chamber 20, the partition wall 23 or the compartment wall 24 corresponds to the bottom surface portion of the present exemplary embodiment.

Actions of the processing unit 16 having a configuration as described above will be described. The wafers W transferred to each processing unit 16 by the substrate transfer device 17 are carried into the chamber 20 through the carry-in/out port 22. The substrate holding mechanism 30 (the substrate holding unit) receives a target wafer W from the wafer holding mechanism of the substrate transfer device 17 with support pins 311 on the holding unit 31.

Here, since the clean gas is always supplied from the FFU 21, a downflow of the clean gas is formed in the chamber 20.

Subsequently, the wafer holding mechanism is retreated from the chamber 20, and the carry-in/out port 22 is closed by the shutter 221. Then, the holding unit 31 is rotated. When the holding unit 31 arrives at a predetermined rotation speed, the nozzle of each of the processing liquid supply mechanisms 40a to 40c is moved to the processing position above the wafer W in a predetermined order to supply an acidic or alkaline chemical liquid, or a rinse liquid, thereby performing a liquid processing.

At this time, as illustrated in FIG. 4, a part of the clean gas flows down in the chamber 20, flows into the recovery cup 50, and then, is exhausted from the exhaust port 52 (the cup exhaust port) to the outside.

Meanwhile, as described above, a swirling flow is generated above the rotating wafer W to flow from a central side towards an outer peripheral side while swirling towards the rotational direction of the wafer W. A part of the swirling flow flows out of the recovery cup 50 through an opening. In FIGS. 3 to 5, a flow of the clean gas in the chamber 20 during the rotation of the wafer W is indicated as broken lines.

Meanwhile, since the recovery cup 50 and the member around the recovery cup 50 (e.g., a sidewall of the chamber 20, the partition wall 23 and compartment wall 24) are blocked in relation to each other by the partition plate 28 whose top surface is flat, the chemical components hardly remain around the recovery cup 50. Therefore, even though the swirling flow flows out from the opening of the recovery cup 50, the phenomenon that the chemical liquid components remaining, for example, in a recess are blown up and re-attached to the wafer W after drying hardly occurs.

Further, when an acidic or alkaline chemical liquid is supplied, the chemical liquid components may be included in the swirling flow flowing out from the recovery cup 50. However, as described above, since the periphery of the recovery cup 50 is blocked by the partition plate 28, there is less possibility to form a region where a swirling flow including the chemical components remains.

And, since the swirling flow is spread towards a radial direction of the wafer W while rotating and moving along the rotation direction of the wafer W, the swirling flow eventually reaches an inner wall of the chamber 20, or a region in the vicinity of the partition wall 23 or the compartment wall 24. Meanwhile, as described above, among the compartment walls 24 surrounding the periphery of the opening 25a, a vertically extending slits 241 are opened on the compartment walls 24 disposed towards a direction intersecting with the tangent lines extending in the rotation direction. Therefore, the swirling flow that reaches the region flows into the space surrounded by the compartments 24 through the slit 241, and is exhausted from the opening 25a to the outside by changing the flow direction to a lower side.

Further, since the partition walls 23 are also disposed in the direction intersecting with the tangent lines extending in the rotation direction of the wafer W, the swirling flow also flows into the region where the processing liquid supply mechanisms 40a to 40c are disposed, through the passage ports 231 formed on the partition walls 23. The swirling flow flows towards the rotation driving unit 44 side from the nozzle unit 41 side when the nozzle unit 41 (the nozzle head 42) is retreated to the retreat position. Then, the swirling flow is exhausted towards the openings 25b to 25d through the slits 241 of the compartment walls 24 disposed near a position facing the rotation driving unit 44 (see, e.g., FIGS. 4 and 5).

As such, the swirling flow, which flows out from the recovery cup 50 and spreads in the chamber 20, is discharged from the space above the recovery cup 50 through the slits 241 of the compartment walls 24 or the passage ports 231 of the partition walls 23. Accordingly, even in a case where chemical liquid components are contained in the swirling flow flowing out from the recovery cup 50 during the processing of the wafer W with the chemical liquid, the chemical liquid components are discharged from the space above the recovery cup 50 by being entrained in the swirling flow. Therefore, there is less concern that the chemical liquid components flow again to the recovery cup 50 and contaminate the wafer W.

From the above-described viewpoint, in the present exemplary embodiment, the sidewall of the chamber 20 on which the carry-in/out port 22 is formed, the respective partition walls 23, and the respective compartment walls 24 correspond to surrounding members that surround the recovery cup 50. Further, the slits 241 provided on the compartment walls 24 facing the space above the recovery cup 50, and the passage ports provided on the partition walls 23 are provided outside the recovery cup 50, and correspond to the exhaust ports that exhaust atmosphere in the region surrounded by the surrounding members and the bottom surface portion.

Further, as described above, the rotation driving units 44 of each of the processing liquid supply mechanisms 40a to 40c are disposed at the positions facing the slits 241. Therefore, even if particles are generated in the rotation driving units 44, the particles are discharged immediately to the outside through the slits 241, so that the particles may be suppressed from entering the recovery cup 50 in which a wafer W is being processed.

The liquid processing of the wafer W using the chemical liquid is performed in this manner, and if a rinsing is performed, a shake-off drying is performed, and then, the rotation of the holding unit 31 is stopped. Then, the wafer W is delivered to the wafer holding mechanism, which enters the chamber 20, in an opposite order to a case of carrying-in, so that the wafer W is carried out from the processing unit 16.

The processing unit 16 (i.e., the liquid processing apparatus) according to the present exemplary embodiment has the following effects. The partition plate 28 is provided to block the space between the recovery cup 50 surrounding the substrate holding mechanism 30 and the surrounding members (the sidewalls of the chamber 20, the partition walls 23, and the compartment walls 24) surrounding the outside of the recovery cup 50. Outside the recovery cup 50, the exhaust ports (the slits 241 and the passage ports 231) are provided to exhaust the atmosphere in the region surrounded by the surrounding members and the partition plate 28.

Since the compartment walls 24 are provided with the vertically extending slits 241, the swirling flow formed in the chamber 20 may be discharged while suppressing any gas from remaining above the partition plate 28.

Further, an atmosphere in spaces which are partitioned from the space above the recovery cup 50 by the partition walls 23 and where the processing supply mechanisms 40a to 40c are disposed is also exhausted through the slits 241 provided on the compartment walls facing the spaces. As a result, the swirling flow formed in the chamber 20 may be discharged through each passage port 231 that passes the nozzle unit 41 or the nozzle arm 43 while suppressing particles generated in the rotation driving units 44 of the processing liquid supply mechanisms 40a to 40c from entering the processing atmosphere of the wafer W.

By the slits 241 or passage ports 231, the chemical liquid components flowing out around the recovery cup 50 may be efficiently discharged from the exhaust ports by using the swirling flow formed above the wafer W that is held and rotated in the substrate holding mechanism 30.

Processing units 16a to 16d as illustrated in FIGS. 6 to 11 are exemplary embodiments that reflect various variations according to the liquid processing apparatus of the present disclosure. In these exemplary embodiments, the same reference numerals are given to the same parts as those illustrated in FIGS. 2 to 5.

Figure 6:
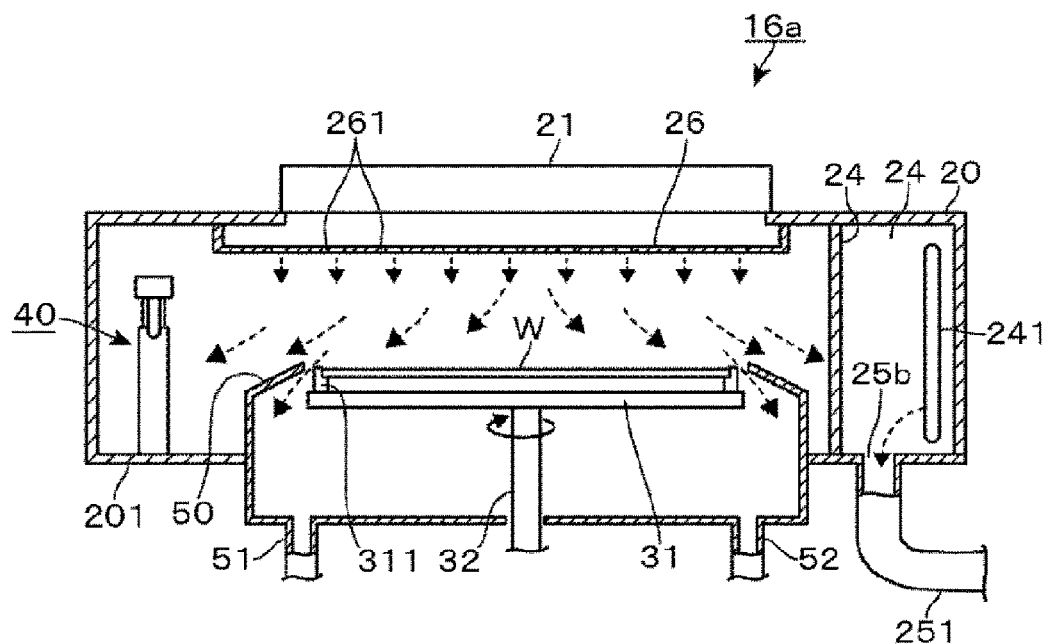
FIG. 6 is a vertical-sectional view illustrating a processing unit according to a second exemplary embodiment.

For example, a processing unit 16a as illustrated in FIG. 6 is not provided with partition walls 23 configured to compart a space between a space above a recovery cup 50 and a region in which each of processing liquid supply mechanisms 40a to 40c is disposed. Accordingly, in this exemplary embodiment, four sidewalls constituting a chamber 20 correspond to surrounding members surrounding a recovery cup 50.

Similarly to the exemplary embodiment as illustrated in FIG. 3, in the processing unit 16a, openings 25a to 25d are disposed at four corners (edges) of the chamber 20, and regions where the openings 25a to 25d are formed, respectively, are comparted from the space above the recovery cup 50 by compartment walls 24. Like the exemplary embodiment as illustrated in FIG. 3, a slit 241 is opened on the compartment wall 24 disposed at a downstream side in a tangential direction of a rotating wafer W so as to intersect with a tangent line. Therefore, a swirling flow flowing out from the recovery cup 50 and flowing in the chamber 20 is discharged from the four slits 241 to the outside through the openings 25a to 25d. From this viewpoint, in the present exemplary embodiment, each of the four slits 241 constitutes an exhaust port configured to exhaust an atmosphere in the region surrounded by the surrounding members.

Further, differently from the processing unit 16 in which the chamber 20 accommodates the entire recovery cup 50, the chamber 20 of the processing unit 16a as illustrated in FIG. 6 accommodates the upper portion of the recovery cup 50, while the lower part of the recovery cup 50 protrudes downwardly from the chamber 20. In the present exemplary embodiment, a bottom plate 201 of the chamber 20 that supports a processing fluid supply unit 40 is disposed so as to surround the outer periphery of the recovery cup 50, and hence, a bottom surface portion is constituted to block a space between the recovery cup 50 and sidewalls of the chamber 20 serving as surrounding members. Here, when the disposition height of the bottom plate 201 is about half the total height of the recovery cup 50 from the top end of the recovery cup 50 to the lower end, the retention of the swirling flow is suppressed, and the sufficient effect of discharging the chemical liquid components is obtained.

Figure 7:
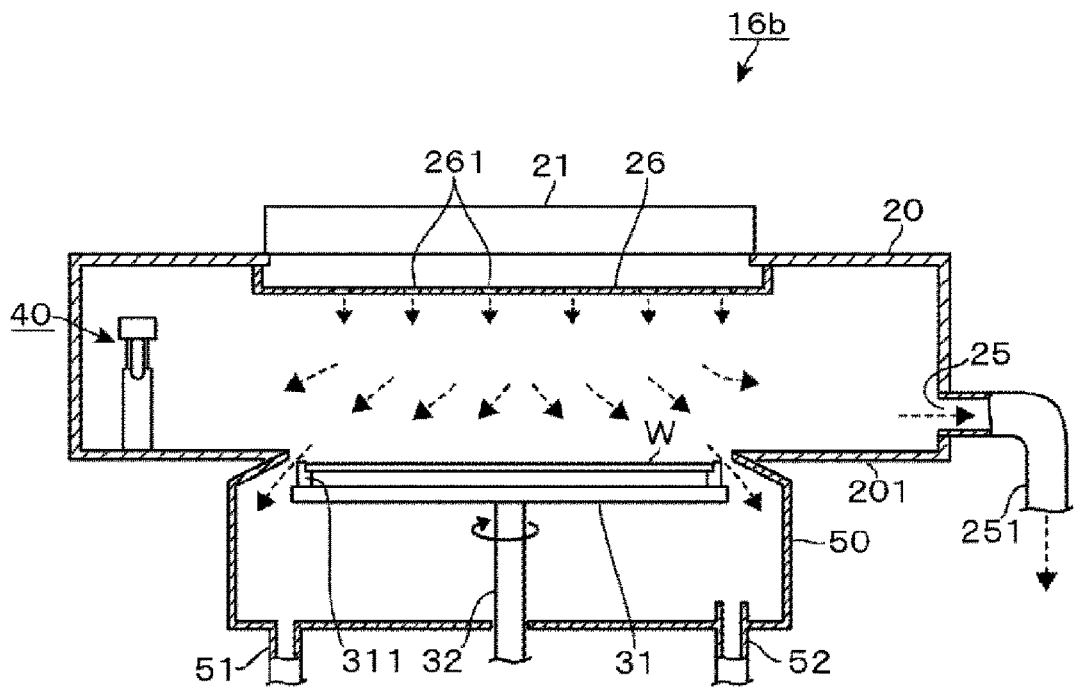
FIG. 7 is a vertical-sectional view illustrating a processing unit according to a third exemplary embodiment.

A processing unit 16b as illustrated in FIG. 7 is an example in which the top end of the recovery cup 50 is disposed to be flush with the bottom plate 201 of the chamber 20. Further, the bottom plate 201 of the chamber 20 may be disposed above the top end of the recovery cup 50. In this case, a cylindrical member extending downwardly from an opening of the bottom plate 201 towards an opening of the recovery cup 50 is provided to block a gap between the bottom plate 201 and the recovery cup 50, and the bottom plate 201 and the cylindrical member are used as a bottom surface portion to block a space between the recovery cup 50 and the sidewalls (the surrounding members) of the chamber 20.

Further, it is not essential that the openings 25a to 25b are provided on the partition plate 28 (the bottom plate 201 in the exemplary embodiment of FIG. 7), the surroundings are surrounded by the compartment walls 24, and the slits 241 provided on the compartment walls 24 are used as exhaust ports to exhaust an atmosphere in the region surrounded by the surrounding members, like the processing unit 16 as illustrated in FIG. 3. For example, as illustrated in FIG. 7, an opening 25 may be opened in a transverse direction to serve as an exhaust port by connecting an exhaust pipe 251 directly to the sidewall of the chamber, which is a surrounding member.

At this time, the exhaust pipe 251 connected to the opening 25 is bent downwardly at a position immediately after gas is exhausted from the chamber 20 so as to guide air flow downwardly. Hence, backflow of the air flow may be suppressed. Further, the shape of the opening 25 is not limited to the slit shape, but may be any other shape such as, for example, circular or rectangular.

Further, at least one of the exhaust ports that exhaust the atmosphere in the region surrounded by the surrounding members may be configured such that its lower end portion is set to be a top surface of the bottom surface portion (the partition plate 28 or the bottom plate 201) opened at a height position and an opening is formed at a height position where retention of the chemical liquid components is hardly generated and the influence of the chemical liquid components due to the liquid processing is negligible, for example, as in the slit 241 illustrated in FIG. 4 or 5, or the opening 25 illustrated in FIG. 7. As a result, retention of the gas containing the chemical liquid components in a region below the exhaust port may be substantially suppressed.

Figure 8:
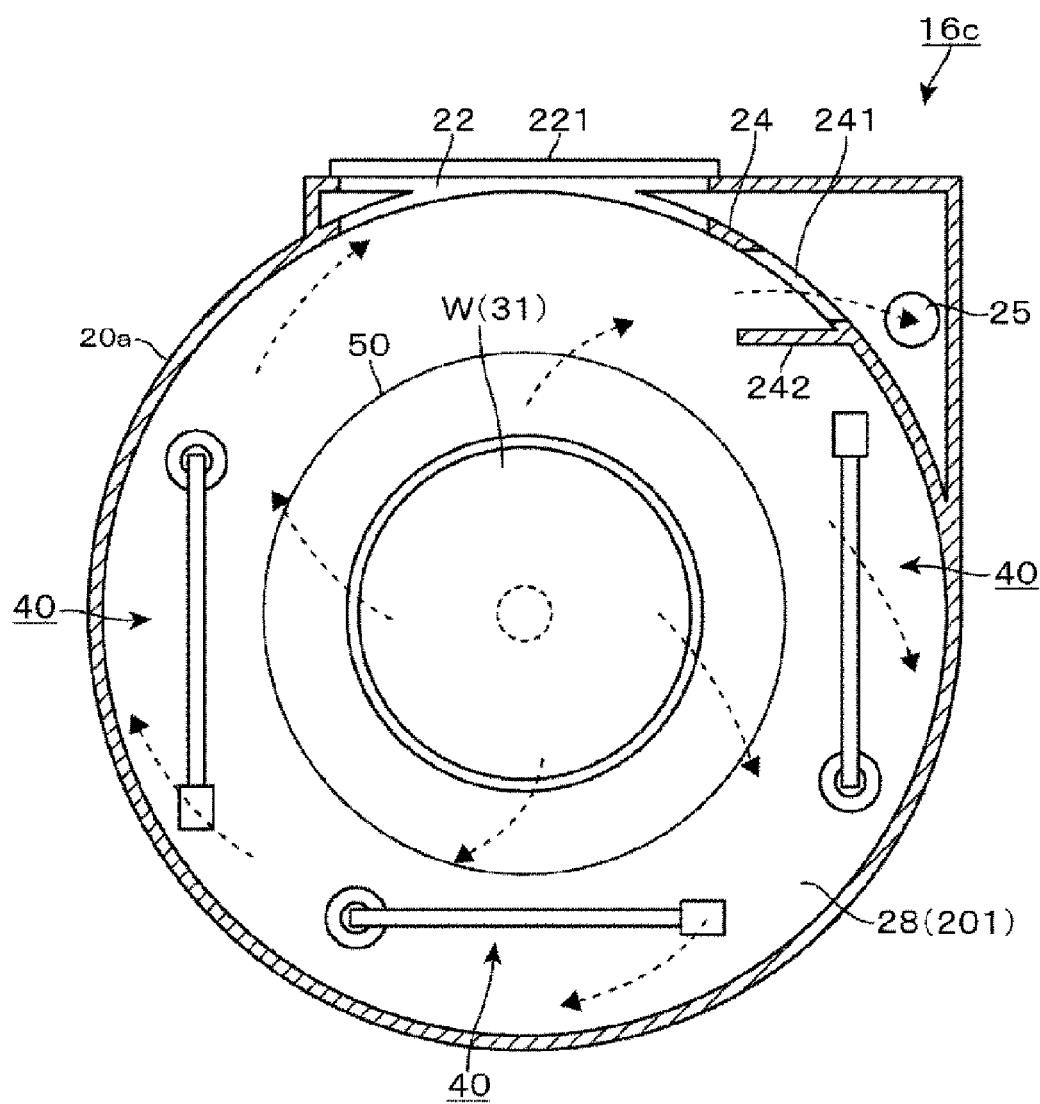
FIG. 8 is a horizontal cross-sectional view illustrating a processing unit according to a fourth exemplary embodiment.

FIG. 8 illustrates an exemplary embodiment of a processing unit 16c in which a chamber 20a is constituted by a cylinder. In the present exemplary embodiment, a sidewall of the chamber 20a having a circular cross-sectional shape constitutes a surrounding member surrounding a recovery cup 50, and a partition plate 28 blocks a space between the recovery cup 50 and the sidewall. A compartment wall 24 constituting a part of the sidewall of the chamber 20 surrounds an opening 25 disposed outside the chamber 20a, and an atmosphere in the chamber 20a is exhausted through a slit 241 which is formed to extend vertically.

Here, differently from the processing unit 16 according to the first exemplary embodiment, which is provided with compartment walls 24 or partition walls 23 disposed in a direction orthogonal to the tangent line extending in the rotation direction of the wafer W, the swirling flow flowing along the wall of the cylindrical chamber 20a is affected by a weak force acting to discharge gas to the outside. Therefore, as illustrated in FIG. 8, the swirling flow may be effectively discharged to the outside by disposing a guide plate 242 at a downstream side in a flow direction of the swirling flow flowing along the wall of the chamber 20a, in the vicinity of the slit 241.

Figure 9:
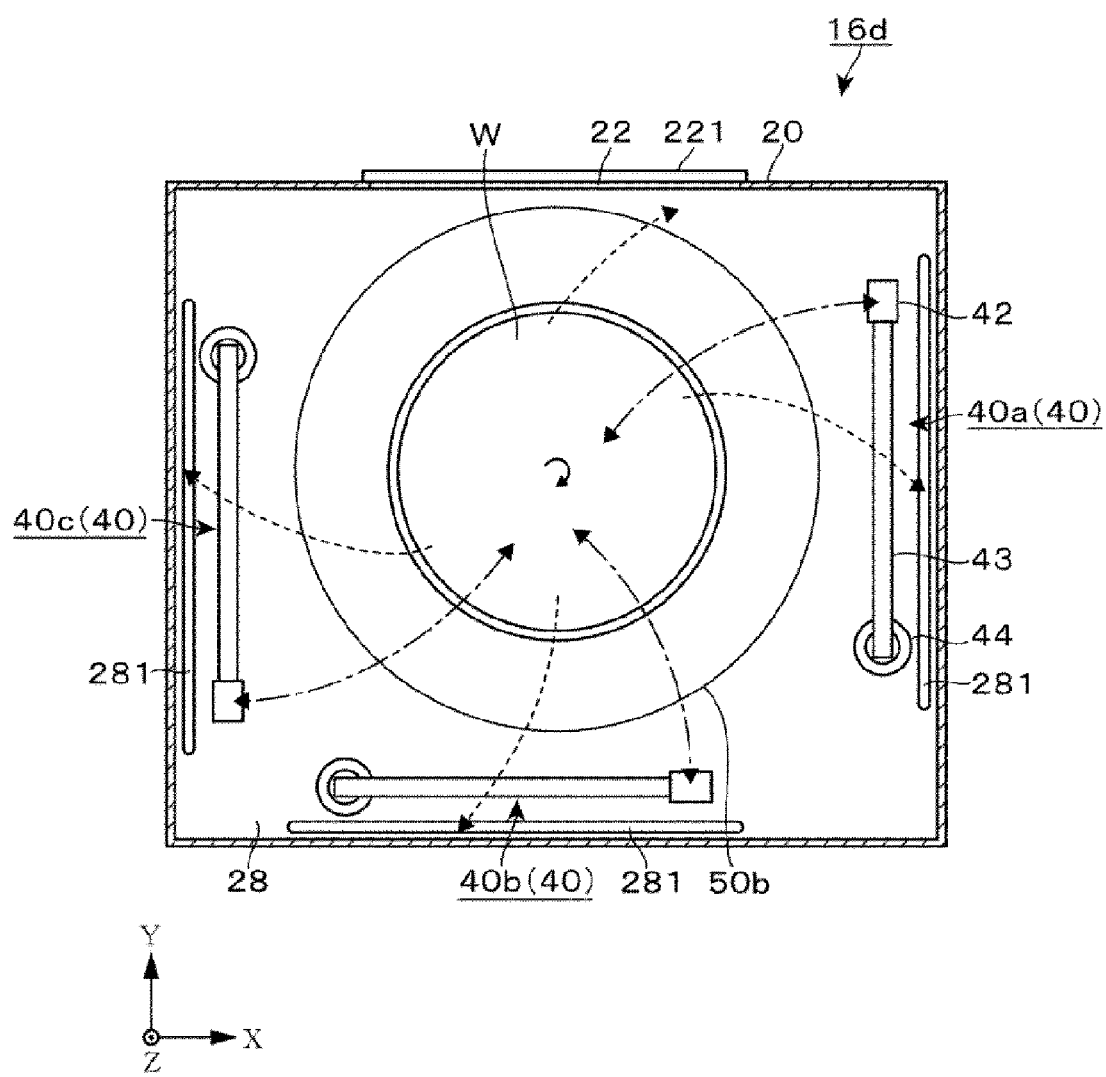
FIG. 9 is a horizontal cross-sectional view illustrating a processing unit according to a fifth exemplary embodiment.
Figure 10:
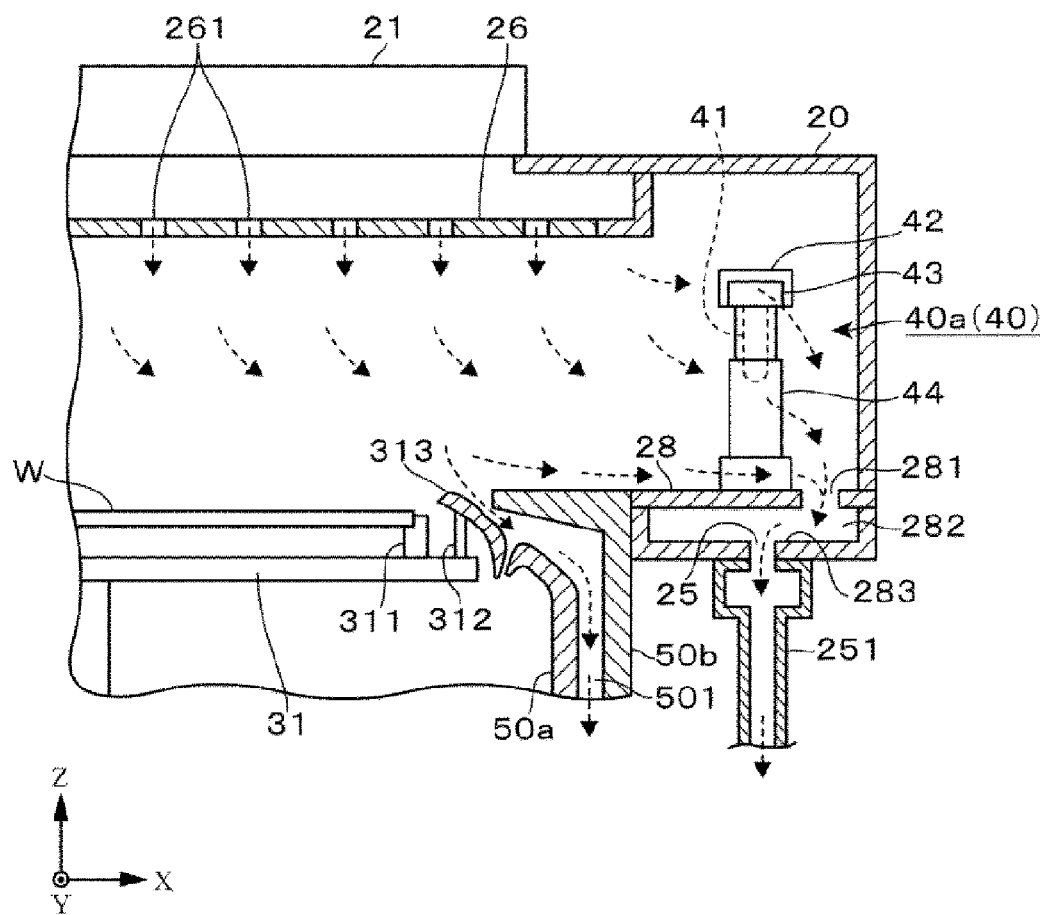
FIG. 10 is a vertical cross-sectional side view illustrating the processing unit according to the fifth exemplary embodiment.
Figure 11:
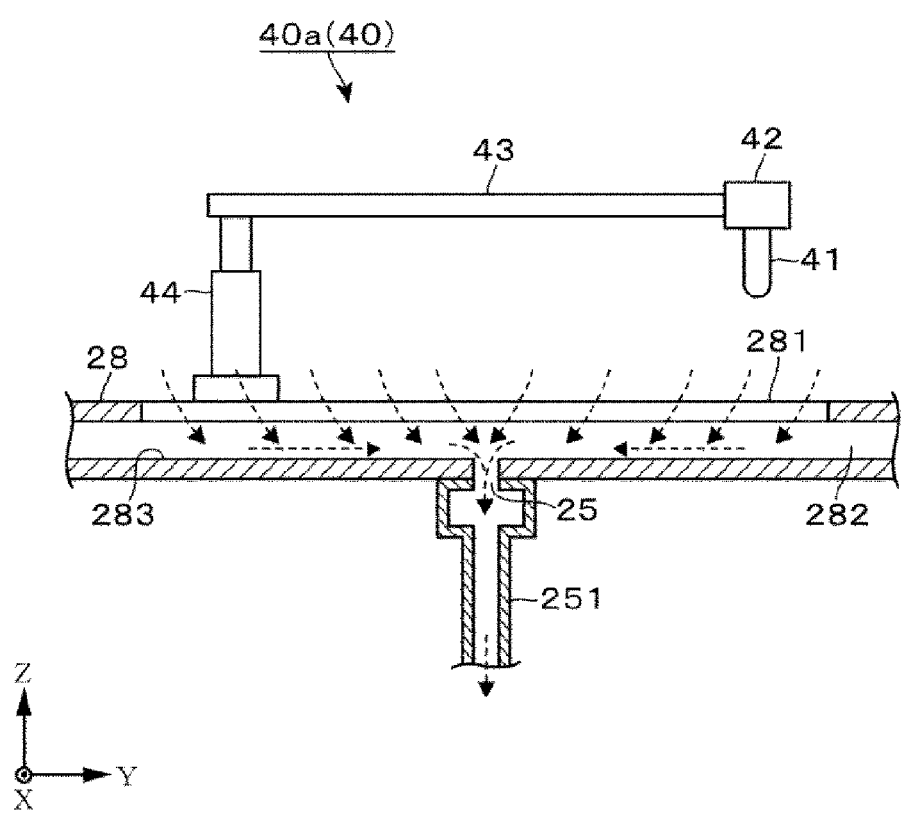
FIG. 11 is a vertical cross-sectional side view illustrating the processing unit according to the fifth exemplary embodiment when viewed from another direction.

Subsequently, FIGS. 9 to 11 illustrate an exemplary embodiment of a processing unit 16d which exhausts an atmosphere in a chamber 20 through a slit 281 provided on a partition plate 28 constituting a bottom surface portion. As illustrated in FIG. 9, in the processing unit 16d of the present exemplary embodiment, processing liquid supply units 40a to 40c are provided near sidewalls of the chamber 20 where a carry-in/out port 22 is not provided.

As illustrated in FIG. 10, the processing unit 16d of the present exemplary embodiment is provided with an annular rotary cup 313 provided above a peripheral portion of a holding unit 31 through support pillars 312 and disposed so as to surround a periphery of a wafer W supported by support pins 311. The rotary cup 313 receives a processing liquid scattered from the wafer W and guides the processing liquids to a downward side. At the lower side of the rotary cup 313, an inner cup 50a is provided to receive the processing liquid guided to the lower side by the rotary cup 313 and guide the processing liquid to a further downward side. The rotary cup 313 and the inner cup 50a are covered from above by an outer cup 50b that forms an exhaust path 501 to exhaust an air flow in a gap with both cups 313, 50a to the outside. In the processing unit 16d, the rotary cup 313 and the inner cup 50a correspond to a first cup, and the outer cup 50b corresponds to a second cup. The first cup and the second cup constitute a cup body.

A bottom portion of the inner cup 50a is formed with an exhaust port (not illustrated) configured to discharge gas supplied from an FFU 21 to the outside of the processing unit 16. In a case where the processing liquid is recovered and recycled to supply the wafer W, it is desirable to discharge the gas not from the exhaust port of the inner cup 50a but from the exhaust path 501. In this case, the processing liquid supplied to the wafer W may be securely separated from the gas, and hence, components of the processing liquid would not be discharged from the exhaust port of the inner cup 50a along with the gas. Therefore, the recovery rate of the processing liquid may be enhanced. Further, in a case of a rinse processing of rinsing the processing liquid and a dry processing of drying the wafer W after the processing liquid is supplied to the wafer W, the gas may be discharged from the exhaust port of the inner cup 50a.

Further, as illustrated in FIG. 9, each of the processing liquid supply mechanisms 40a to 40c is in a state where nozzle arms 43 are arranged substantially in parallel along the sidewalls of the chamber 20 when nozzle heads 42 (nozzle units 41) are retreated to a retreat position. When the chamber 20 is viewed from the top, slits 281 are formed between the nozzle arms 43 moved to the retreat positions and the sidewalls of the chamber 20, respectively, to extend in parallel with the nozzle arms 43 and the chamber 20.

It may be said that slits 281 are formed on the partition plate 28 (the bottom surface portion) at the positions facing the sidewalls of the chamber 20, which constitute surrounding members, so as to extend along the sidewalls. Here, the "positions facing the sidewalls of the chamber 20" corresponds to the positions where the slits 281 are disposed facing the sidewalls of the chamber 20. In order to prevent stagnation of the gas, the positions where the slits 281 are formed are preferably as close to the sidewall of the chamber 20 as possible. Each of the slits 281 is preferably formed in a region which is 50 mm or less far from an intersection position of the partition plate 28 and the sidewalls of the chamber 20 (hereinafter, also referred to as a "peripheral region").

As long as the slits 281 may be disposed between the processing liquid supply mechanisms 40a to 40c and the sidewalls of the chamber 20 and the atmosphere in the chamber 20 may be exhausted, the width dimension of each of the slits 281 is not particularly limited, but, may be, for example, several mm to several cm. Meanwhile, the length of each slit 281 is longer than a distance from a tip end (the nozzle head 42) of each of the processing liquid supply mechanisms 40a to 40c retreated to the retreat position to a base end (a rotation driving unit 44) such that the slit 281 is disposed along a region from the tip end to the base end.

As illustrated in FIGS. 10 and 11, the underside of the region where each slit 281 is formed is configured as a double bottom provided with an additional downward plate 283 below the partition plate 28, and a buffer space 282 is formed between the partition plate 28 and the downward plate 283, so that an air flow exhausted from the chamber 20 flows into the buffer space 282. In the processing unit 16d of the present exemplary embodiment, the downward plate 283 corresponds to a first bottom surface portion, and the partition plate 28 corresponds to a second bottom surface portion provided above the first bottom surface portion. The first bottom surface portion and the second bottom surface portion constitute a bottom surface portion.

An opening 25 is formed on the downward plate 283. The opening 25 is connected with an exhaust pipe 251 which is an exhaust unit configured to exhaust an atmosphere in the buffer space 282. Further, FIGS. 10 and 11 illustrate an exemplary configuration of a mechanism for performing exhaust from the slit 281 formed along the processing liquid supply mechanism 40a. However, the other regions where the other processing liquid supply mechanisms 40b, 40c are provided also adopt the same configuration.

Further, as illustrated in FIGS. 9 and 10, the partition plate 28 is formed without a gap with respect to the outer cup 50b.

To summarize the contents as described above, an exhaust port for exhausting an atmosphere in a region surrounded by the sidewalls (surrounding members) of the chamber 20a and the partition plate 28 is constituted as a slit 281 formed on the partition plate 28. Further, as is clear from FIG. 9, slits 281 are provided outside the outer cup 50b.

Subsequently, actions of the processing unit 16d will be described. As illustrated in FIG. 10, a clean gas supplied from the FFU 21 is supplied into the chamber 20 through a rectifying plate 26 to form a downflow. A part of the downflow flowing down in the chamber 20 flows into the exhaust path 501 formed between an outer peripheral surface of the rotary cup 313 and the inner cup 50a and an inner peripheral surface of the outer cup 50b, and is exhausted from the exhaust path 501 to the outside. Further, a part of the remaining downflow flows down in the chamber 20 and flows towards the peripheral region near the sidewall of the chamber 20, which is a region provided with the slit 281. The FFU 21 or the rectifying plate 26 corresponds to the descending air current forming unit in the present exemplary embodiment.

Meanwhile, an air flow flowing out from the outer cup 50b to the outside due to a swirling flow generated during the processing of the wafer W is guided along the top surface of the flat partition plate 28 provided without a gap in relation to the outer cup 50b to the slits 281 provided in the peripheral region. And, the air flow from the downflow as described above and the air flow from the outer cup 50b join and enter the slits 281, and flow into the buffer space 282.

Then, both the air flows are exhausted to the exhaust pipe 251. Accordingly, since a flow overflowing from the outer cup 50b is guided to the slits 281 by using the partition plate 28, and each slit 281 is provided at a position where stagnation of the gas hardly occurs, an efficient exhaust is realized.

Also in the processing unit 16d of the present exemplary embodiment, since the air flow flowing out from the outer cup 50b to the outside due to a swirling flow flows into the slit 281 through the flat partition plate 28, remaining chemical components are blown up. However, the chemical components are hardly re-attached to the wafer W due to this. Especially, the air flow and a part of the downflow gather in the peripheral region of the chamber 20 and are exhausted in a mass from the slit 281 provided in the region to the outside. As a result, the air flow flowing on the partition plate 28 may be restrained by the downflow supplied from the upward side so that turbulence of the air flow may be effectively suppressed.

Further, since the slits 281 are formed between the processing liquid supply mechanisms 40a to 40c retreated to the retreat position and the sidewalls of the chamber 20 along the processing liquid supply mechanisms 40a to 40c, particles generated in the processing liquid supply mechanisms 40a to 40c may be exhausted near the generation position to the outside. In addition, by performing the exhaust using the slit 281, an air flow may evenly flow in the disposition regions of the processing liquid supply mechanisms 40a to 40c, and hence, an effect of discharging the particles generated in the processing liquid supply mechanisms 40a to 40c may be enhanced. Further, since the regions around the processing liquid supply mechanisms 40a to 40c are regions where stagnation is likely to occur, an effect of promoting discharge of the chemical components may also be obtained by forming an air flow flowing from the outer cup 50b towards the regions.

Here, in the processing unit 16d of the present exemplary embodiment in which exhaust ports (i.e. the slits 281) are provided in the partition plate 28 constituting the bottom surface portion, it is not essential that the slits 281 are provided along the processing liquid supply mechanisms 40a to 40c, as in the example illustrated in FIG. 9. For example, a slit 281 may be formed on the partition plate 28 along the sidewall of the chamber 20 which is provided with the carry-in/out port 22. Of course, even in a case where some of the processing liquid supply mechanisms 40a to 40c are not provided near the sidewalls of the chamber 20, the slits 281 may be provided along the sidewalls in regions facing the sidewalls of the chamber 20 (peripheral regions) to exhaust a part of the downflow and the air flow flowing out from the outer cup 50b in a mass.

In addition, the configuration of the exhaust ports provided in the peripheral regions is not limited to the slits 281. For example, a plurality of circular exhaust ports may be disposed at intervals in a direction extending along the sidewalls of the chamber 20.

In the processing units 16, 16a to 16d according to the respective exemplary embodiments as described above, the processing units 16, 16a to 16d are not limited to a case configured to process the top surface of the wafer W. For example, the liquid processing may be performed on both of the top surface and the bottom surface of the wafer W by supplying the processing liquid to the bottom surface of the wafer W through the holding unit 31 as well. Further, the present disclosure may, of course, be applied to the processing units 16, 16a to 16d which performs a processing only on the bottom surface of the wafer W.

And, the kind of the substrate which is able to be processed using the liquid processing unit (the liquid processing apparatus) of the present disclosure is not limited to the semiconductor wafer. For example, the present disclosure may also be applied to a liquid processing unit which performs a liquid processing of a glass substrate for flat panel display.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus in which a liquid processing is performed by supplying a processing liquid, the apparatus comprising:
    a rotatable substrate holder configured to hold a substrate;
    a cup body configured to surround the substrate holder and provided with an opening above the substrate;
    a surrounding member configured to surround the cup body outside of the cup body;
    a processing liquid supply mechanism including:
        a nozzle configured to supply the processing liquid to the substrate;
        a nozzle arm configured to hold the nozzle at a tip end of the nozzle arm; and
        a rotation driver provided at a base end portion of the nozzle arm and configured to rotationally drive the nozzle arm around the base end portion so as to move the nozzle between a processing position above the substrate held in the substrate holder and a retreat position retreated from the processing position,
        wherein the retreat position is set to a position where the nozzle arm of the processing liquid supply mechanism is disposed to extend along the surrounding member;
    an air flow forming portion configured to form a descending air flow in the surrounding member from an upper side of the surrounding member;
    a bottom surface portion provided along a circumferential direction of the cup body and configured to block a space between the cup body and the surrounding member; and
    at least one exhaust port provided outside the cup body to exhaust an atmosphere in a region surrounded by the surrounding member and the bottom surface portion,
    wherein the surrounding member includes a compartment wall configured to form an enclosed region together with the surrounding member and the bottom surface portion, the exhaust port being vertically formed in the compartment wall such that a flow path is formed to guide the exhausted air flow through the enclosed region and downwardly through an opening in the bottom surface portion.

2. The liquid processing apparatus of claim 1, wherein the at least one exhaust port is opened towards a direction intersecting with a tangent line extending in a rotation direction of the substrate holder in a circle centered at a rotation center of the substrate holder.

3. The liquid processing apparatus of claim 1, further comprising a flow path configured to allow the air flow exhausted from the exhaust port to flow downwardly.

4. The liquid processing apparatus of claim 1, wherein the at least one exhaust port is a plurality of exhaust ports provided along the circumferential direction of the cup body.

5. The liquid processing apparatus of claim 1, wherein the at least one exhaust port is provided at a corner of the surrounding member configured in a rectangular shape when viewed from the top.

6. The liquid processing apparatus of claim 1,
    wherein the rotation driver is provided at a position facing the exhaust port.

7. The liquid processing apparatus of claim 6, wherein the surrounding member is provided with a partition wall which is configured to partition a region in which the processing liquid supply mechanism is provided and a space above the cup body, and is provided with a passage port configured to pass the nozzle arm holding the nozzle, and
    the passage port is used as an exhaust port instead of the exhaust port provided at a position facing the rotation driver to exhaust the atmosphere in the region surrounded by the surrounding member and the bottom surface portion and to exhaust an atmosphere in a region where the processing liquid supply mechanism is provided from the position facing the rotation driver.

8. The liquid processing apparatus of claim 1, wherein the exhaust port is a vertically extending slit.

9. The liquid processing apparatus of claim 1, wherein the cup body is provided with a first cup configured to receive the processing liquid supplied to the substrate and a second cup configured to cover the first cup from the top, such that an exhaust path is formed between the first cup and the second cup, and
    the bottom surface portion is provided without a gap with the second cup.

10. The liquid processing apparatus of claim 9, wherein a rotary cup is provided at an upper side of the substrate holder so as to surround a periphery of the substrate and configured to downwardly guide a portion of the processing liquid.

11. The liquid processing apparatus of claim 1, wherein the bottom surface portion is provided at a position where a top surface of the bottom surface portion is flush with an upper end of the cup body.

12. The liquid processing apparatus of claim 1, wherein a disposition height of the bottom surface portion is in a range from the top end of the cup body to about half the total height of the cup body below the top end of the cup body.

13. The liquid processing apparatus of claim 1, wherein an exhaust pipe connected to the exhaust port is bent downwardly at a position immediately after gas is exhausted from the chamber.

14. The liquid processing apparatus of claim 1, wherein the exhaust port extending upwardly from a lower end position near the top surface of the bottom surface portion is opened in a transverse direction on the compartment wall disposed at a downstream side in a tangential direction of a rotating wafer so as to intersect with a tangent line.

15. A liquid processing apparatus in which a liquid processing is performed by supplying a processing liquid, the apparatus comprising:
    a rotatable substrate holder configured to hold a substrate;
    a cup body configured to surround the substrate holder and provided with an opening above the substrate;
    a cylindrical surrounding member configured to surround the cup body outside of the cup body;
    a processing liquid supply mechanism including:
        a nozzle configured to supply the processing liquid to the substrate;

a nozzle arm configured to hold the nozzle at a tip end of the nozzle arm; and a rotation driver provided at a base end portion of the nozzle arm and configured to rotationally drive the nozzle arm around the base end portion so as to move the nozzle between a processing position above the substrate held in the substrate holder and a retreat position retreated from the processing position, wherein the retreat position is set to a position where the nozzle arm of the processing liquid supply mechanism is disposed to extend along the surrounding member;

an air flow forming portion configured to form a descending air flow in the cylindrical surrounding member from an upper side of the cylindrical surrounding member body;

a bottom surface portion provided along a circumferential direction of the cup body and configured to block a space between the cup body and the surrounding member; and an exhaust port provided outside the cup body to exhaust an atmosphere in a region surrounded by the surrounding member and the bottom surface portion, wherein the exhaust port is vertically formed in the cylindrical surrounding member, above and separate from the bottom surface portion, and the cylindrical surrounding member is provided with a vertically positioned guide plate extending therefrom, the guide plate being configured to guide the air flow flowing along the cylindrical surrounding member towards the exhaust port.

* * * * *